United States Patent
Sharma et al.

(10) Patent No.: US 12,211,886 B1
(45) Date of Patent: Jan. 28, 2025

(54) INDUCTORS WITH AIRGAP ELECTRICAL ISOLATION

(71) Applicant: GlobalFoundries U.S. Inc., Malta, NY (US)

(72) Inventors: Prateek Kumar Sharma, Bangalore (IN); Venkata Narayana Rao Vanukuru, Karnataka (IN); Kevin K. Dezfulian, Arlington, VA (US); Kenneth J. Giewont, Hopewell Junction, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/765,489

(22) Filed: Jul. 8, 2024

(51) Int. Cl.
    *H01L 21/768* (2006.01)
    *H01L 21/764* (2006.01)
    *H01L 49/02* (2006.01)

(52) U.S. Cl.
    CPC ............ *H01L 28/10* (2013.01); *H01L 21/764* (2013.01); *H01L 21/76816* (2013.01)

(58) Field of Classification Search
    CPC . H01L 28/10; H01L 23/5222; H01L 23/5227; H01L 21/764; H01L 29/0649; H01L 21/7682; H01F 2017/0086; H01F 2017/0073; H01F 17/0033; H01F 2017/004; H01F 2017/008; H01F 17/0006; H01F 41/041; H01F 3/14
    See application file for complete search history.

(56) References Cited

U.S. PATENT DOCUMENTS

| | | | | |
|---|---|---|---|---|
| 5,844,299 A | * | 12/1998 | Merrill | H01L 28/10 257/E21.022 |
| 6,180,995 B1 | | 1/2001 | Hebert | |
| 6,274,920 B1 | * | 8/2001 | Park | H01L 27/08 257/E21.022 |
| 6,326,314 B1 | | 12/2001 | Merrill et al. | |
| 6,835,631 B1 | | 12/2004 | Zhen et al. | |

OTHER PUBLICATIONS

A. Bhaskar et al., "Substrate Engineering of Inductors on SOI for Improvement of Q-Factor and Application in LNA," in IEEE Journal of the Electron Devices Society, vol. 8, pp. 959-969, 2020, doi: 10.1109/JEDS.2020.3019884.

J. Y . . . —C. Chang, A. A. Abidi and M. Gaitan, "Large suspended inductors on silicon and their use in a 2-mu m CMOS RF amplifier," in IEEE Electron Device Letters, vol. 14, No. 5, pp. 246-248, May 1993, doi: 10.1109/55.215182.

* cited by examiner

*Primary Examiner* — Raj R Gupta
(74) *Attorney, Agent, or Firm* — Thompson Hine LLP; Francois Pagette

(57) ABSTRACT

Structures including an inductor and methods of forming such structures. The structure comprises a semiconductor substrate including a first plurality of sealed cavities and a back-end-of-line stack on the semiconductor substrate. Each sealed cavity includes an air gap, and the back-end-of-line stack includes an inductor having a winding that overlaps with the sealed cavities.

20 Claims, 3 Drawing Sheets

INDUCTORS WITH AIRGAP ELECTRICAL ISOLATION

BACKGROUND

The disclosure relates to semiconductor device fabrication and integrated circuits and, more specifically, to structures including an inductor and methods of forming such structures.

Inductors represent a type of on-chip passive device commonly employed in many types of integrated circuits designed to operate at high frequencies. Inductors may be fabricated within one or more of the metallization levels of a back-end-of-line stack on the chip. An inductor may be characterized by a quality factor, which is a figure-of-merit representing a measure of the relationship between energy loss and energy storage. A high value for the quality factor reflects low energy losses to the substrate of the chip. However, increasing the quality factor is achieved at the expense of increasing the size of the inductor. The design of an on-chip inductor often must balance, as a tradeoff, the space occupied by the inductor on the chip with the value of the quality factor of the inductor.

Improved structures including an inductor and methods of forming such structures are needed.

SUMMARY

In an embodiment of the invention, a structure comprises a semiconductor substrate including a plurality of sealed cavities and a back-end-of-line stack on the semiconductor substrate. Each sealed cavity includes an air gap, and the back-end-of-line stack includes an inductor having a winding that overlaps with the sealed cavities.

In an embodiment of the invention, a method of forming a device structure is provided. The method comprises forming a plurality of sealed cavities in a semiconductor substrate and forming a back-end-of-line stack on the semiconductor substrate. Each sealed cavity includes an air gap, and the back-end-of-line stack includes an inductor having a winding that overlaps with the sealed cavities.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
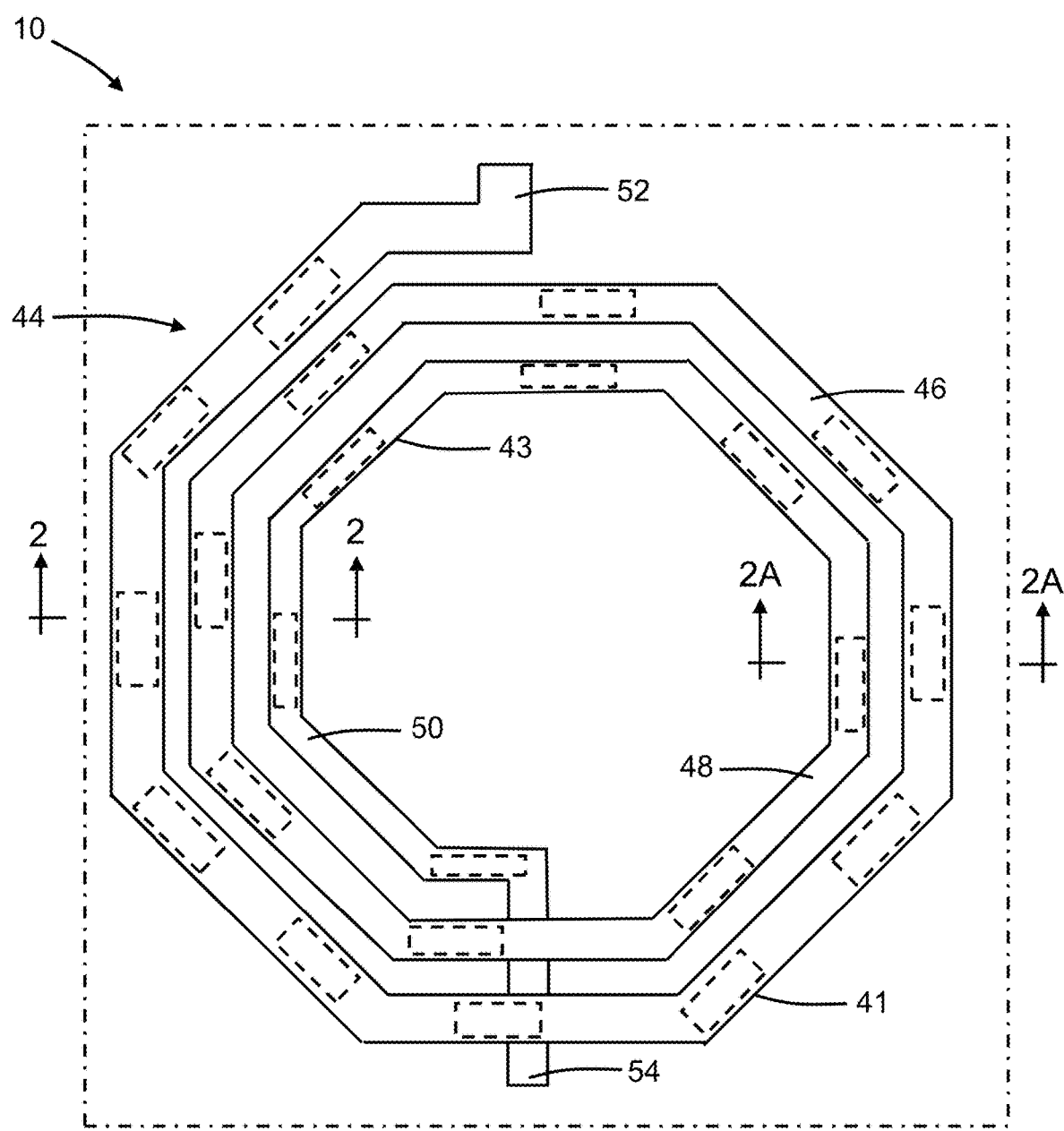
FIG. 1 is a top view of a structure in accordance with embodiments of the invention.
Figure 2:
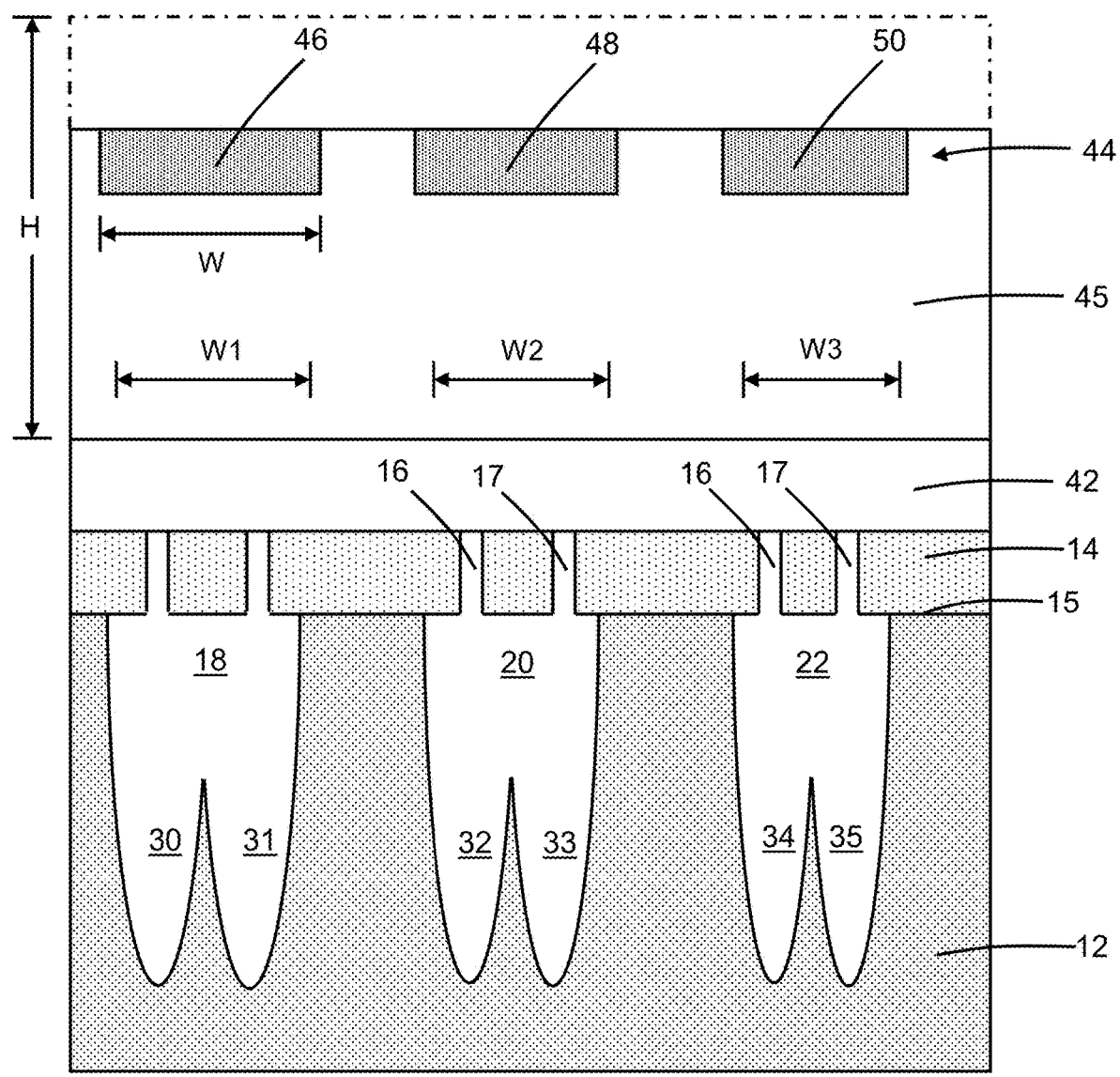
FIG. 2 is a cross-sectional view taken generally along line 2-2 in FIG. 1.
Figure 2A:
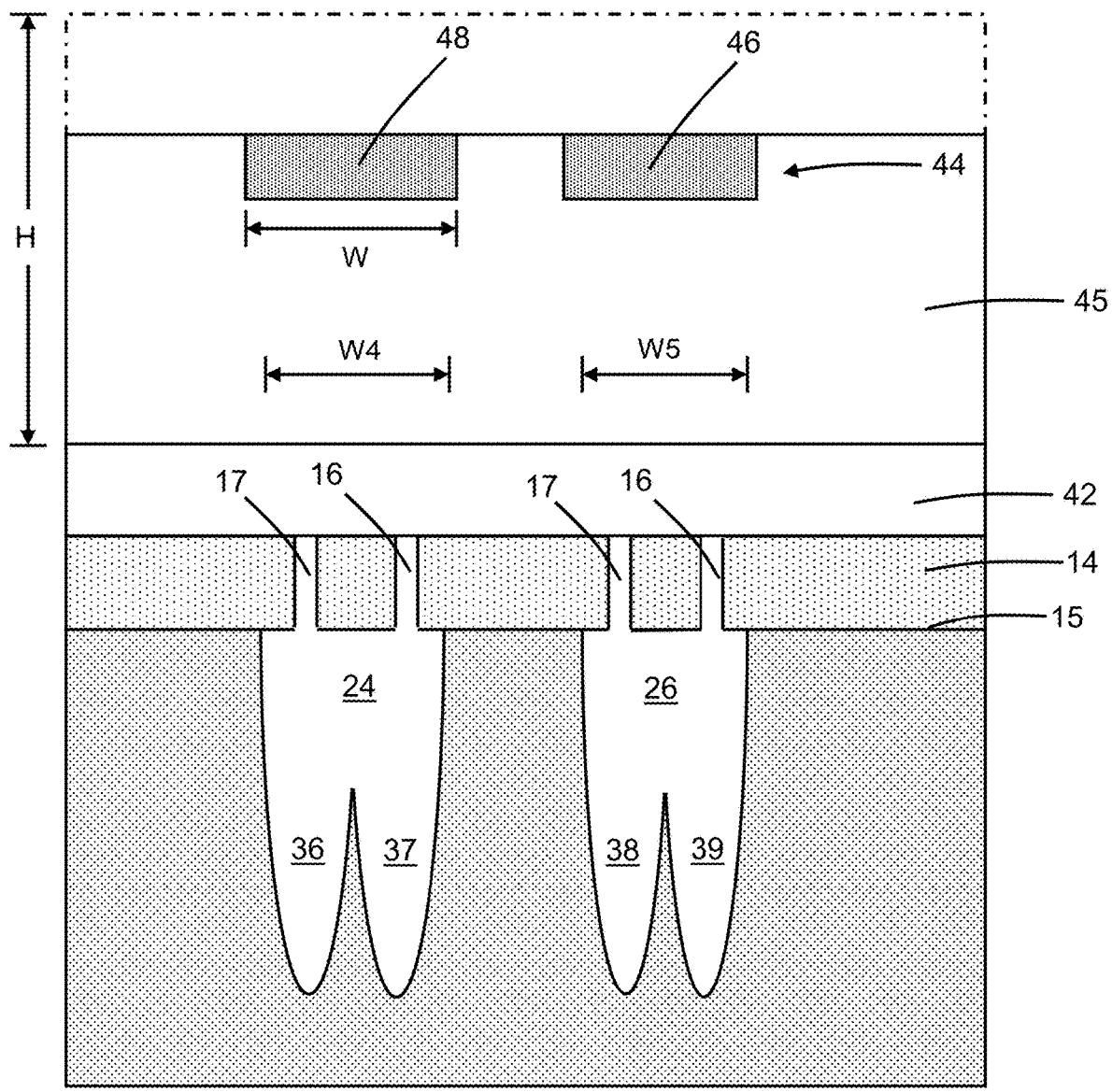
FIG. 2A is a cross-sectional view taken generally along line 2A-2A in FIG. 1.

With reference to FIGS. 1, 2, 2A and in accordance with embodiments of the invention, a structure 10 includes a semiconductor substrate 12 and a dielectric layer 14 on the semiconductor substrate 12. In an embodiment, the semiconductor substrate 12 may be comprised of a semiconductor material, such as single-crystal silicon, and the dielectric layer 14 may be comprised of a dielectric material, such as silicon dioxide. The dielectric layer 14 adjoins the semiconductor substrate 12 along a horizontal interface 15. The semiconductor substrate 12 and the dielectric layer 14 may be included as a handle substrate and a buried oxide layer of a silicon-on-insulator substrate.

Pilot openings 16, 17 may be formed that extend fully through the dielectric layer 14 and then penetrate past the horizontal interface 15 to a depth into the semiconductor substrate 12. The pilot openings 16, 17 may be formed by an anisotropic etching process. In an embodiment, the pilot openings 16, 17 may be arranged in adjacent spaced-apart pairs.

Cavities 18, 20, 22, 24, 26 may be formed in the semiconductor substrate 12 as undercuts beneath the dielectric layer 14. Specifically, the cavities 18, 20, 22, 24, 26 may be formed in the semiconductor substrate 12 by an isotropic etching process that relies on the pilot openings 16, 17 for ingress and egress of an etchant to remove portions of the semiconductor substrate 12. Each of the cavities 18, 20, 22, 24, 26 is associated with at least a pair of the pilot openings 16, 17 and, in an embodiment, each of the cavities 18, 20, 22, 24, 26 is associated with multiple pairs of the pilot openings 16, 17. The isotropic etching process includes a vertical etching component and a lateral etching component that result in each of the cavities 18, 20, 22, 24, 26 being deepened and widened relative to the initial depth and width of the portion of the pilot openings 16, 17 in the semiconductor substrate 12. In an embodiment, the isotropic etching process may be a dry etching process. The cavities 18, 20, 22, 24, 26 may have different widths that progressively narrow in a prescribed manner, as subsequently discussed. In an embodiment, cavities 18, 20, 22, 24, 26 may have equal lengths. In an alternative embodiment, two or more of the cavities 18, 20, 22, 24, 26 may have unequal lengths.

In an embodiment, the cavity 18 may include adjacent chambers 30, 31 having upper portions that that merge together during the isotropic etching process. The adjacent chambers 30, 31 of the cavity 18 are respectively associated with the overlying pair of pilot openings 16, 17, the formation of the chamber 30 initiates at the pilot opening 16 in the overlying pair, and the formation of the chamber 31 initiates at the adjacent pilot opening 17 in the overlying pair. The merged upper portions of the chambers 30, 31 result because of the lateral advance of the etch fronts in the semiconductor substrate 12 from the pair of pilot openings 16, 17. The cavity 18 and, more specifically, the upper portions of the chambers 30, 31 of the cavity 18 may be coextensive with (i.e., share a boundary with) the horizontal interface 15 between the semiconductor substrate 12 and the dielectric layer 14.

The cavity 18 has a maximum width W1, which may occur adjacent to the horizontal interface 15 between the semiconductor substrate 12 and the dielectric layer 14. In an embodiment, the maximum width W1 may coincide with the horizontal interface 15 between the semiconductor substrate 12 and the dielectric layer 14. The width W1 of the cavity 18 may narrow with increasing depth from the horizontal interface 15. The cavity 18 has a maximum depth that may be measured relative to the horizontal interface 15. The lower portions of the chambers 30, 31 may be curved and may have a "W" shape with a cusped portion of the semiconductor substrate 12 separating the lower portions of the chambers 30, 31.

In an embodiment, the cavity 20 may include adjacent chambers 32, 33 having upper portions that that merge during the isotropic etching process. The adjacent chambers 32, 33 of the cavity 20 are respectively associated with the overlying pair of pilot openings 16, 17, and the formation of the chamber 32 initiating at the pilot opening 16 in the overlying pair and the formation of the chamber 32 initiates at the pilot opening 17 in the overlying pair. The merged upper portions of the chambers 32, 33 result because of the lateral advance of the etch fronts from the pair of pilot openings 16, 17. The cavity 20 and, more specifically, the upper portions of the chambers 32, 33 may be coextensive with (i.e., share a boundary with) the horizontal interface 15 between the semiconductor substrate 12 and the dielectric layer 14.

The cavity 20 has a maximum width W2, which may occur adjacent to the horizontal interface 15 between the semiconductor substrate 12 and the dielectric layer 14. In an embodiment, the maximum width W2 may coincide with the horizontal interface 15 between the semiconductor substrate 12 and the dielectric layer 14. The maximum width W2 of the cavity 20 may be less than the maximum width W1 of the cavity 18. The width difference may result from the pilot openings 16, 17 used to form the cavity 20 having a smaller spacing than the pilot openings 16, 17 used to form the cavity 18. The width W2 of the cavity 20 may narrow with increasing depth from the horizontal interface 15. The cavity 20 has a maximum depth that may be measured relative to the horizontal interface 15. The lower portions of the chambers 32, 33 may be curved and may have a "W" shape with a cusped portion of the semiconductor substrate 12 separating the lower portions of the chambers 32, 33.

In an embodiment, the cavity 22 may include adjacent chambers 34, 35 having upper portions that that merge during the isotropic etching process. The adjacent chambers 34, 35 of the cavity 22 are associated with the overlying pair of pilot openings 16, 17 with the formation of the chamber 34 initiating at the pilot opening 16 in the overlying pair and the formation of the chamber 34 initiating at the pilot opening 17 in the overlying pair. The merged upper portions of the chambers 34, 35 result because of the lateral advance in the semiconductor substrate 12 of the etch fronts from the pair of pilot openings 16, 17. The cavity 22 and, more specifically, the upper portions of the chambers 34, 35 may be coextensive with (i.e., share a boundary with) the horizontal interface 15 between the semiconductor substrate 12 and the dielectric layer 14.

The cavity 22 has a maximum width W3, which may occur adjacent to the horizontal interface 15 between the semiconductor substrate 12 and the dielectric layer 14. In an embodiment, the maximum width W3 may coincide with the horizontal interface 15 between the semiconductor substrate 12 and the dielectric layer 14. The maximum width W3 of the cavity 22 may be less than the maximum width W2 of the cavity 20. The width difference may result from the pilot openings 16, 17 used to form the cavity 22 having a smaller spacing than the pilot openings 16, 17 used to form the cavity 20. The width W3 of the cavity 22 may narrow with increasing depth from the horizontal interface 15. The cavity 22 has a maximum depth that may be measured relative to the horizontal interface 15. The lower portions of the chambers 34, 35 may be curved and may have a "W" shape with a cusped portion of the semiconductor substrate 12 separating the lower portions of the chambers 34, 35.

In an embodiment, the cavity 24 may include adjacent chambers 36, 37 having upper portions that that merge during the isotropic etching process. The adjacent chambers 36, 37 of the cavity 24 are associated with the overlying pair of pilot openings 16, 17 with the formation of the chamber 36 initiating at the pilot opening 17 in the overlying pair and the formation of the chamber 36 initiating at the pilot opening 17 in the overlying pair. The merged upper portions of the chambers 36, 37 result because of the lateral advance in the semiconductor substrate 12 of the etch fronts from the pair of pilot openings 16, 17. The cavity 24 and, more specifically, the upper portions of the chambers 36, 37 may be coextensive with (i.e., share a boundary with) the horizontal interface 15 between the semiconductor substrate 12 and the dielectric layer 14.

The cavity 24 has a maximum width W4, which may occur adjacent to the horizontal interface 15 between the semiconductor substrate 12 and the dielectric layer 14. In an embodiment, the maximum width W4 may coincide with the horizontal interface 15 between the semiconductor substrate 12 and the dielectric layer 14. The maximum width W4 of the cavity 24 may be less than the maximum width W3 of the cavity 22. The width difference may result from the pilot openings 16, 17 used to form the cavity 24 having a smaller spacing than the pilot openings 16, 17 used to form the cavity 22. The width W4 of the cavity 24 may narrow with increasing depth from the horizontal interface 15. The cavity 24 has a maximum depth that may be measured relative to the horizontal interface 15. The lower portions of the chambers 36, 37 may be curved and may have a "W" shape with a cusped portion of the semiconductor substrate 12 separating the lower portions of the chambers 36, 37.

In an embodiment, the cavity 26 may include adjacent chambers 38, 39 having upper portions that that merge during the isotropic etching process. The adjacent chambers 38, 39 of the cavity 26 are associated with the overlying pair of pilot openings 16, 17 with the formation of the chamber 38 initiating at the pilot opening 16 in the overlying pair and the formation of the chamber 38 initiating at the pilot opening 17 in the overlying pair. The merged upper portions of the chambers 38, 39 result because of the lateral advance in the semiconductor substrate 12 of the etch fronts from the pair of pilot openings 16, 17. The cavity 26 and, more specifically, the upper portions of the chambers 38, 39 may be coextensive with (i.e., share a boundary with) the horizontal interface 15 between the semiconductor substrate 12 and the dielectric layer 14.

The cavity 26 has a maximum width W5, which may occur adjacent to the horizontal interface 15 between the semiconductor substrate 12 and the dielectric layer 14. In an embodiment, the maximum width W5 may coincide with the horizontal interface 15 between the semiconductor substrate 12 and the dielectric layer 14. The maximum width W5 of the cavity 26 may be less than the maximum width W4 of the cavity 24. The width difference may result from the pilot openings 16, 17 used to form the cavity 26 having a smaller spacing than the pilot openings 16, 17 used to form the cavity 24. The width W3 of the cavity 26 may narrow with increasing depth from the horizontal interface 15. The cavity 26 has a maximum depth that may be measured relative to the horizontal interface 15. The lower portions of the chambers 38, 39 may be curved and may have a "W" shape with a cusped portion of the semiconductor substrate 12 separating the lower portions of the chambers 39, 39.

A dielectric layer 42 is formed on, and over, the dielectric layer 14. The dielectric layer 42 extends over, and closes, the entrance to the open distal end of each of the pilot openings 16, 17. The closure of the pilot openings 16, 17 seals the cavities in the semiconductor substrate 12 of which the cavities 18, 20, 22, 24, 26 are representative. The dielectric layer 42 may be comprised of a dielectric material, such as silicon dioxide, that is an electrical insulator.

The cavities 18, 20, 22, 24, 26, after being sealed by the formation of the dielectric layer 42, include respective airgaps that are unfilled by solid dielectric material and are instead filled by a gas, such as air. The airgap inside each of the sealed cavities 18, 20, 22, 24, 26 may be characterized by a permittivity or dielectric constant of near unity (i.e., vacuum permittivity), which is less than the permittivity of solid dielectric material. The airgap inside each of the sealed cavities 18, 20, 22, 24, 26 may be filled by atmospheric air at or near atmospheric pressure, may be filled by another gas at or near atmospheric pressure, or may contain atmospheric air or another gas at a sub-atmospheric pressure (e.g., a partial vacuum).

Additional cavities like the cavities 18, 20, 22, 24, 26 may be formed in the semiconductor substrate 12, as shown in FIG. 1, and then sealed by the formation of the dielectric layer 42. The cavities, of which the cavities 18, 20, 22, 24, 26 are representative, are distributed in a pattern with prescribed density and width, as subsequently described. The cavities may be discrete and disconnected from each other.

A back-end-of-line stack 45 may be formed that includes an inductor 44 in at least one of its metallization levels. The inductor 44 includes turns or windings 46, 48, 50 that are arranged in a single spiral with the winding 46 being the outermost turn in the coiled arrangement and the winding 50 being the innermost turn in the coiled arrangement. The inductor 44 includes a terminal 52 and a terminal 54 that may be used to establish electrical connections used to power the inductor 44 during operation. The width W and cross-sectional area of the inductor 44 progressively narrow between the connection of the outer winding 46 to the terminal 52 and the connection of the inner winding 50 to the terminal 54 with the largest width W and cross-sectional area occurring adjacent to the connection of the outer winding 46 to the terminal 52 and the smallest width W and cross-sectional area occurring adjacent to the connection of the inner winding 50 to the terminal 54. The inductor 44 has an outer perimeter 41 established by the outer winding 46 and an inner perimeter 43 established by the inner winding 50.

The inductor 44 has a length between an end at the connection of the outer winding 46 to the terminal 52 and an opposite end at the connection of the inner winding 50 to the terminal 54. The length of the inductor 44 is a measurement from one end to the opposite end and is the largest of the three dimensions (e.g., length, width, and thickness) of the inductor 44. The inductor 44 spirals along its length between the opposite ends as the windings 46, 48, 50 progressively tighten with shrinking radius. In an embodiment, the width W of the windings 46, 48, 50 may be greater than the respective widths of the overlapped sealed cavities at any position along the length of the inductor 44.

The back-end-of-line stack 45 includes interlayer dielectric layers comprised of dielectric materials, such as silicon dioxide or silicon nitride, that electrically insulating and that are disposed in a layer stack. The windings 46, 48, 50 may be formed by a damascene process in which trenches are formed by lithography and etching processes in one of the interlayer dielectric layers and those trenches and via openings are filled with one or more conductors (e.g., one or more metals) that are deposited and planarized. The primary conductor of the windings 46, 48, 50 may be comprised of a metal, such as copper or aluminum. The back-end-of-line stack 45, which may include metallization levels formed over the metallization level including the inductor 44, has a height H. In an embodiment, the depths of the cavities 18, 20, 22, 24, 26 relative to the horizontal interface 15 may be substantially equal to the height H. In an alternative embodiment, the depths of the cavities 18, 20, 22, 24, 26 relative to the horizontal interface 15 may be less than the height H.

The windings 46, 48, 50 of the inductor 44 are disposed over, and overlap with, the sealed cavities, of which the cavities 18, 20, 22, 24, 26 are representative, in the semiconductor substrate 12. The cavity 18 and the cavity 26 are positioned beneath portions of the winding 46, the cavity 20 and the cavity 24 are positioned beneath portions of the winding 48, and the cavity 26 is positioned beneath a portion of the winding 46. In an embodiment, portions of the winding 46 respectively overlap with the cavity 18 and the cavity 26, portions of the winding 48 respectively overlap with the cavity 20 and the cavity 24, and a portion of the winding 50 overlaps with the cavity 26. In an embodiment, the respective portions of winding 46 may fully overlap with the cavity 18 and the cavity 26, the respectively portions of the winding 48 may fully overlap with the cavity 20 and the cavity 24, and the portion of the winding 50 may fully overlap with the cavity 22.

The sealed cavities are arranged in a single spiral that is overlapped by the single spiral including the windings 46, 48, 50. The footprint represented by the outer perimeter 41 and the inner perimeter 43 of the inductor 44 may be projected in a vertical direction relative to the horizontal interface 15 between the semiconductor substrate 12 and the dielectric layer 14. The inner perimeter 43 may circumscribe and surround a core region of the inductor 44 that lacks windings and, when projected downwardly to the semiconductor substrate 12, the inner perimeter 43 of the inductor 44 coincides with a region of the semiconductor substrate 12 that lacks cavities and that is interior to the region of the semiconductor substrate 12 that includes the cavities 18, 20, 22, 24, 26.

The sealed cavities, of which the cavities 18, 20, 22, 24, 26 are representative, have a non-uniform width dimension over the length of the inductor 44. For example, the width dimension of the sealed cavities may decrease with increasing distance along the length of the inductor 44 from the terminal 52. For example, the width W1 of the cavity 18 beneath the winding 46 may be greater than the width W5 of the cavity 26 also beneath the winding 46, the width W2 of the cavity 20 beneath the winding 48 may be greater than the width W4 of the cavity 24 also beneath the winding 48, the width W1 of the cavity 18 and the width W5 of the cavity 26 beneath the winding 46 may be greater than the width W2 of the cavity 20 beneath the winding 48 and the width W4 of the cavity 24 beneath the winding 48, and the cavity 22 beneath the winding 50 may have a width W3 that is less than the widths W1, W2 and that is less than the widths W4, W5. The decrease in the width dimension along the length of the inductor 44 may be correlated with the terminal 52 being biased at a larger potential, during operation, than the terminal 54. In an embodiment, the rate of decrease of the width dimension of the sealed cavities may be described by a linear function. In an alternative embodiment, the rate of decrease of the width dimension of the sealed cavities may be described by a non-linear function, such as a linear function, a quadratic function, an exponential function, etc.

The density of the sealed cavities, which may be represented by the inter-cavity spacing, may decrease along the length of the inductor 44 between the end at the connection of the outer winding 46 to the terminal 52 and the opposite end at the connection of the inner winding 50 to the terminal 54. In that regard, the density of the sealed cavities beneath the winding 46 may be greater than the density of the sealed cavities beneath the winding 48, and the density of the sealed cavities beneath the winding 48 may be greater than the density of the sealed cavities beneath the winding 50.

The inductor 44 may be deployed as a peaking inductor in a silicon photonics trans-impedance amplifier. The sealed cavities, of which the cavities 18, 20, 22, 24, 26 are representative, are non-uniformly placed in the semiconductor substrate 12 beneath the windings 46, 48, 50 of the inductor 44. The sealed cavities include air gaps characterized by a low permittivity. The non-uniform distribution of the sealed cavities beneath the windings 46, 48, 50 of the inductor 44 may optimize the inductor performance benefit without violating design rule checks. For example, the airgaps included in the cavities 18, 20, 22, 24, 26 may function to increase the quality factor for the inductor 44 by reducing energy losses to the semiconductor substrate 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
 a semiconductor substrate including a first plurality of sealed cavities, each of the first plurality of sealed cavities including a first air gap; and
 a back-end-of-line stack on the semiconductor substrate, the back-end-of-line stack including an inductor, the inductor having a terminal and a first winding terminating at the terminal, the first winding overlapping with the first plurality of sealed cavities, and the first plurality of sealed cavities having a first width dimension that decreases with increasing distance from the terminal.

2. The structure of claim 1 wherein the semiconductor substrate includes a second plurality of sealed cavities, the inductor includes a second winding that is surrounded by the first winding, and the second winding overlaps with the second plurality of sealed cavities.

3. The structure of claim 2 wherein the second plurality of sealed cavities have a second width dimension, and the first width dimension is greater than the second width dimension.

4. The structure of claim 3 wherein the first plurality of sealed cavities have a first density, the second plurality of sealed cavities have a second density, and the first density is greater than the second density.

5. The structure of claim 2 wherein the first plurality of sealed cavities have a first density, the second plurality of sealed cavities have a second density, and the first density is greater than the second density.

6. The structure of claim 2 wherein the first winding and the second winding are arranged in a first single spiral, and the first plurality of sealed cavities and the second plurality of sealed cavities are arranged in a second single spiral that is overlapped by the first single spiral.

7. The structure of claim 2 wherein the first plurality of sealed cavities are separated from the second plurality of sealed cavities by portions of the semiconductor substrate.

8. The structure of claim 2 wherein each of the second plurality of sealed cavities includes a second air gap.

9. The structure of claim 2 wherein the first plurality of sealed cavities are non-uniformly distributed beneath the first winding, and the second plurality of sealed cavities are non-uniformly distributed beneath the second winding.

10. The structure of claim 1 wherein the first plurality of sealed cavities are separated from each other by portions of the semiconductor substrate.

11. The structure of claim 1 wherein the first plurality of sealed cavities are non-uniformly distributed beneath the first winding.

12. The structure of claim 1 wherein the first winding fully overlaps with the first plurality of sealed cavities.

13. The structure of claim 1 wherein the back-end-of-line stack has a height, and the first plurality of sealed cavities have a depth that is substantially equal to the height.

14. The structure of claim 13 further comprising:
 a dielectric layer between the inductor and the semiconductor substrate, the dielectric layer having a horizontal interface with the semiconductor substrate, and the first plurality of sealed cavities are coextensive with the horizontal interface.

15. The structure of claim 1 further comprising:
   a dielectric layer between the inductor and the semiconductor substrate.

16. The structure of claim 1 wherein each of the first plurality of sealed cavities includes a first chamber having an upper portion and a second chamber having an upper portion merged with the upper portion of the first chamber.

17. The structure of claim 16 wherein the first chamber and the second chamber have a W-shape with a cusped portion of the semiconductor substrate between a lower portion of the first chamber and a lower portion of the second chamber.

18. The structure of claim 1 wherein the first width dimension of the first plurality of sealed cavities decreases linearly with increasing distance from the terminal.

19. The structure of claim 1 wherein the first width dimension of the first plurality of sealed cavities decreases non-linearly with increasing distance from the terminal.

20. A method of forming a device structure, the method comprising:
   forming a plurality of sealed cavities in a semiconductor substrate; and
   forming a back-end-of-line stack on the semiconductor substrate,
   wherein each of the plurality of sealed cavities including an air gap, and the back-end-of-line stack includes an inductor, the inductor has a terminal and a winding terminates at the terminal, the winding overlaps with the plurality of sealed cavities, and the plurality of sealed cavities have a width dimension that decreases with increasing distance from the terminal.

* * * * *

UNITED STATES PATENT AND TRADEMARK OFFICE
CERTIFICATE OF CORRECTION

PATENT NO. : 12,211,886 B1
APPLICATION NO. : 18/765489
DATED : January 28, 2025
INVENTOR(S) : Prateek Kumar Sharma et al.

It is certified that error appears in the above-identified patent and that said Letters Patent is hereby corrected as shown below:

In the Specification

Column 3, Line 4 reads:
"overlying pair and the formation of the chamber 32 initiates"
It should read:
--overlying pair and the formation of the chamber 33 initiates--

Column 3, Line 36 reads:
"the formation of the chamber 34 initiating at the pilot"
It should read:
--the formation of the chamber 35 initiating at the pilot--

Column 4, Lines 1-2 read:
"the formation of the chamber 36 initiating at the pilot opening 17 in the overlying pair."
It should read:
--the formation of the chamber 37 initiating at the pilot opening 16 in the overlying pair.--

Column 4, Lines 33-35 read:
"38 initiating at the pilot opening 16 in the overlying pair and the formation of the chamber 38 initiating at the pilot opening 17 in the overlying pair."
It should read:
--38 initiating at the pilot opening 17 in the overlying pair and the formation of the chamber 39 initiating at the pilot opening 16 in the overlying pair.--

Column 4, Line 53 reads:
"cavity 24. The width W3 of the cavity 26 may narrow with"
It should read:
--cavity 24. The width W5 of the cavity 26 may narrow with--

Signed and Sealed this
Fifteenth Day of July, 2025

Coke Morgan Stewart
*Acting Director of the United States Patent and Trademark Office*

CERTIFICATE OF CORRECTION (continued)
U.S. Pat. No. 12,211,886 B1

Column 4, Line 59 reads:
"ing the lower portions of the chambers 39, 39."
It should read:
--ing the lower portions of the chambers 38, 39.--